United States Patent
Shaw et al.

(10) Patent No.: US 12,431,924 B2
(45) Date of Patent: Sep. 30, 2025

(54) DIGITAL PRE-DISTORTION CALIBRATION OF A RADIO FREQUENCY POWER AMPLIFIER

(71) Applicant: Cypress Semiconductor Corporation, San Jose, CA (US)

(72) Inventors: Amit Shaw, Bangalore (IN); Kempraju Gopinath, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 23 days.

(21) Appl. No.: 18/335,038

(22) Filed: Jun. 14, 2023

(65) Prior Publication Data
US 2024/0421839 A1    Dec. 19, 2024

(51) Int. Cl.
*H04B 1/04*       (2006.01)
*H03F 1/32*       (2006.01)

(52) U.S. Cl.
CPC ......... *H04B 1/0475* (2013.01); *H03F 1/3241* (2013.01); *H04B 2001/045* (2013.01)

(58) Field of Classification Search
CPC .......... H04B 1/0475; H04B 2001/0408; H04B 2001/0425; H04B 2001/0433; H04B 2001/045; H03F 1/32; H03F 1/3241; H03F 1/3247
See application file for complete search history.

(56) References Cited

U.S. PATENT DOCUMENTS

| | | | | |
|---|---|---|---|---|
| 7,034,612 B2* | 4/2006 | Kim | ..................... | H03F 1/3247 327/551 |
| 8,340,602 B1* | 12/2012 | Peiris | ..................... | H03F 1/3241 455/114.3 |
| 8,526,537 B2* | 9/2013 | Chen | ..................... | H04B 1/0475 375/297 |

* cited by examiner

*Primary Examiner* — Betsy Deppe

(57) ABSTRACT

Methods and systems for improving digital pre-distortion calibration of a radio frequency power amplifier. The disclosed method includes, among other things, initiating digital pre-distortion calibration of a power amplifier of a radio frequency (RF) module, determining, based on a transmission power of a training signal transmitted to the power amplifier between a first transmission power value and a second transmission power value, a set of estimated coefficients, generating, based on a subset of the set of estimated coefficients, a set of predicted coefficients, wherein the set of predicted coefficients are derived from a fitting curve applied to the subset of the set of estimated coefficients, and storing the set of estimated coefficients and the set of predicted coefficients.

20 Claims, 4 Drawing Sheets

300

---

Initiate digital pre-distortion calibration of a power amplifier of a radio frequency (RF) module.
310

---

Determine, based on a transmission power of a training signal transmitted to the power amplifier between a first transmission power value and a second transmission power value, a set of estimated coefficients.
320

---

Generate, based on a subset of the set of estimated coefficients, a set of predicted coefficients, wherein the set of predicted coefficients are derived from a fitting curve applied to the subset of the set of estimated coefficients.
330

---

Store the set of estimated coefficients and the set of predicted coefficients.
340

FIG. 3

DIGITAL PRE-DISTORTION CALIBRATION OF A RADIO FREQUENCY POWER AMPLIFIER

TECHNICAL FIELD

The present disclosure pertains to wireless devices. More specifically, the present disclosure pertains to improving digital pre-distortion calibration of a radio frequency power amplifier.

BACKGROUND

Wireless local area networks (WLAN), such as Wi-Fi® networks and other networks operating under the IEEE 802.11 standards or other wireless standards, provide wireless connection in various battery-operated applications, such as portable gaming consoles, automotive infotainment, etc.

BRIEF DESCRIPTION OF THE DRAWINGS

FIG. 3 is a flow diagram of an example method of pre-distortion calibration of the radio frequency power amplifier, in accordance with some embodiments.

DETAILED DESCRIPTION

Figure 1:
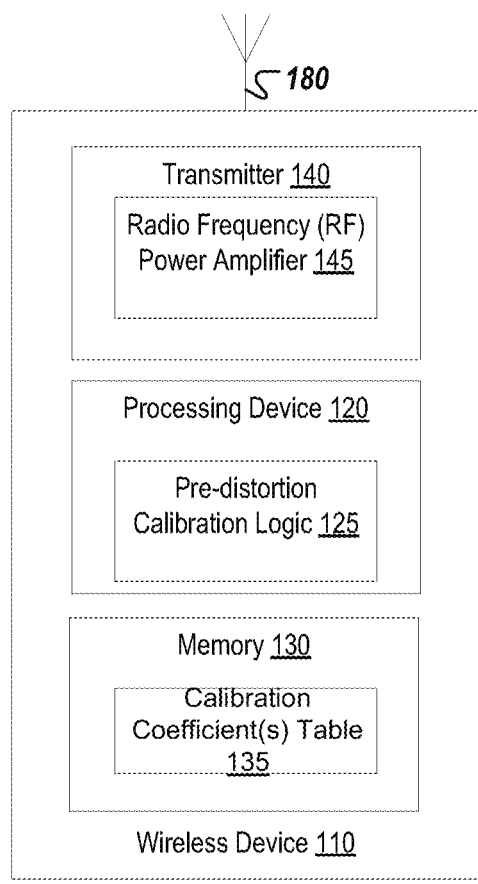
FIG. 1 is a block diagram of an example wireless device for pre-distortion calibration of a radio frequency power amplifier, in accordance with some embodiments.

Radio frequency (RF) modules, such as WLAN modules, generally use radio frequency power amplifiers (e.g., power amplifiers) to convert low-power radio-frequency signals into higher power radio-frequency signals to drive an antenna of a transmitter. The higher-power radio-frequency signals produced by the power amplifier assist low-power radio-frequency signals in being transmitted over further distances. Typically, power amplifiers must balance the tradeoff between linearity and power efficiency. The linearity of a power amplifier refers to the ability of the power amplifier to produce signals that are accurate copies of the input. The power efficiency of a power amplifier refers to the amount of input power that gets converted to output power which impacts the quality of the signal. This tradeoff becomes increasingly important when the RF modules are incorporated into battery-operated devices. More specifically, the power efficiency of the power amplifier becomes more important because if the power amplifier has poor power efficiency, the battery of the battery-operated device will be drained. Thus, power amplifiers, especially those incorporated into battery-operated devices, are designed to be as power efficient as possible, thereby producing non-linear power amplifiers. Non-linear power amplifiers may compress and/or amplify the signal of various amplitudes by various amounts. This is in contrast to linear power amplifiers, which compress and/or amplify signals of various amplitudes by a fixed amount.

Accordingly, digital baseband techniques are implemented to compensate for the tradeoff of the linearity of the power amplifier for the power efficiency of the power amplifier. Digital baseband techniques, such as digital pre-distortion (DPD) or power amplifier pre-distortion (PAPD), are used to linearize the power amplifier. Typical digital baseband techniques input a training signal, such as a sinusoid or similar type of signal, swept between a range of input power values to learn the non-linearity of the power amplifier. However, these techniques may violate various regulatory requirements associated with power spectral density (PSD). PSD refers to the amount of power over a given bandwidth. For example, transmitting the training signal at high power to learn the non-linearity of the power amplifier typically results in a PSD that violates these regulatory requirements.

Compliance with these regulatory requirements requires that the training signal not be transmitted at high power. Not transmitting the training signal at high power to learn the non-linearity of the power amplifier reduces the performance of the power amplifier since the entire range of input power values was unable to be used for learning the non-linearity of the power amplifier. The use of a wideband training signal, instead of a narrowband training signal, prevents the training signal when transmitted at higher power from violating regulatory requirements associated with PSD. The wideband training signal may significantly increase current consumption the longer these techniques are performed.

Aspects and embodiments of the present disclosure address these and other limitations of the existing technology by enabling systems and methods of predicting one or more coefficients of the power amplifier at high power. Responsive to the initiation of a digital pre-distortion calibration of a power amplifier of an RF module, a set of calibration coefficients (e.g., a set of estimated coefficients) is determined. In some embodiments, the set of estimated calibration coefficients is determined by incrementing, stepwise, the transmission power of a narrowband training signal between an initial transmission power value and a specified transmission power value. The narrowband training signal is transmitted, with each increase, to the power amplifier of the RF module. The power amplifier may provide the output power as feedback to assist in determining an estimated coefficient at each transmission power. In some embodiments, the set of estimated calibration coefficients is determined by transmitting a wideband training signal, having a large dynamic range of sample transmission power, to the power amplifier of the RF module. The power amplifier may provide as feedback the output power to assist in the determination of an estimated coefficient at each of the sample transmission power. The set of estimated calibration coefficients is stored in memory.

Curve fitting may be performed on a specified number of the set of estimated coefficients (e.g., a subset of the set of estimated coefficients). The specific number may be a predetermined number or dynamically determined. A fitted curve associated with the curve fitting is generated for the subset of the set of estimated coefficients. Additional coefficients may be determined by interpolating and/or extrapolating the fitted curve. Interpolating the fitted curve generates additional coefficients within a range of transmission power associated with the subset of the set of estimated coefficients. Extrapolating the fitted curve generates additional coefficients (e.g., predicted coefficients) outside the range of transmission power associated with the set of estimated coefficients. The additional coefficients (e.g., the predicted coefficients) are stored in memory.

Aspects of the present disclosure overcome these deficiencies and others by predicting coefficients at higher transmission power that violate regulatory limits, thereby increasing the power amplifier's performance and reducing the time training signals are sent to the power amplifier for calibration, thereby reducing current consumption during calibration.

FIG. 1 is a diagram of one embodiment of an example network device (e.g., wireless device 110), in accordance with some embodiments. Wireless device 110 may be implemented as an integrated circuit (IC) device (e.g., disposed on a single semiconductor die). The wireless device 110 includes various modules and components, but it should be understood that some modules and components may be absent for brevity.

Wireless device 110 may include a transmitter 140 coupled to one or more antenna(s) 180 configured to transmit and receive radio waves. The antennas 180 can be a single antenna, a multiple-input, multiple-output (MIMO) antenna, multiple antennas, multiple MIMO antennas, or the like. The transmitter 140 generates a radio frequency alternating current to be applied to the one or more antenna(s) 180, thereby causing the one or more antenna(s) 180 to radiate radio waves. The transmitter 140 may include a radio frequency (RF) power amplifier 145 to increase the power of the signal, thus increasing the range of the radio waves. The RF power amplifier 145 may be coupled between the input signal and one or more antenna(s) 180. The RF power amplifier 145 increases the power of the signal by converting a low-power radio-frequency signal into a higher-power signal.

Wireless device 110 may further include one or more processing devices 120. In some embodiments, processing device(s) 120 may include one or more central processing units (CPUs), finite state machines (FSMs), field-programmable gate arrays (FPGAs), application-specific integrated circuits (ASIC), or the like. The processing device(s) 120 may be a single processing device that executes various operations of calibrating parameters of the RF power amplifier 145 of wireless device 110. In some embodiments, wireless device 110 may have a dedicated processor for improving the digital pre-distortion calibration of the RF power amplifier 145, which is separate from a processor that executes other operations on wireless device 110 (e.g., processes associated with data transmission and reception).

The processing device(s) 120 may include a pre-distortion calibration logic 125 (e.g., calibration logic 125) to learn the non-linearity of the RF power amplifier 145. The calibration logic 125 may be initiated in response to a trigger event. The trigger event may include a power-up of the wireless device, the temperature of the wireless device exceeding a predetermined temperature value, or the time since the last initiation of the calibration logic 125 exceeds a predetermined time value. Once initiated, the calibration logic 125 may transmit a training signal to the RF power amplifier 145. The training signal may be sinusoidal.

In some embodiments, the training signal may be a narrowband signal (e.g., narrowband training signal). The calibration logic 125 may set a transmission power of the narrowband training signal. Initially, the transmission power is an initial transmission power value. The transmission power of the narrowband training signal is set, and the narrowband training signal is transmitted, by the calibration logic 125, to the RF power amplifier 145. The calibration logic 125 can receive, from the RF power amplifier 145, a loopback signal which provides an output power of the RF power amplifier 145 associated with the transmission power of the narrowband training. The calibration logic 125 may determine an estimated calibration coefficient (e.g., estimated coefficient) based on the loopback signal (e.g., the output power). The calibration logic 125 adds an entry into a calibration table 135 and stores the estimated coefficient in the newly added entry indexed by the transmission power. The calibration table 135 may be stored in memory 130 of the wireless device 110, which may be (or include) a non-volatile, e.g., read-only (ROM) memory, and/or a volatile, e.g., random-access (RAM) memory.

The calibration logic 125 may incrementally increase the transmission power by a step value (or a predetermined adjustment value) until a specified transmission power is reached (i.e., between the initial transmission power and the specified transmission power). With each increase, the calibration logic 125 updates the transmission power of the narrowband training signal. The calibration logic 125 transmits the narrowband training signal to the RF power amplifier 145 to receive the loopback signal. The calibration logic 125 determines an estimated coefficient based on the loopback signal. The calibration 125 adds an entry into the calibration table 135 and stores the estimated coefficient in the newly added entry indexed by the updated transmission power.

In some embodiments, the specified transmission power may be a predetermined transmission power based on regulatory regulations associated with PSD. In other embodiments, the specified transmission power may be dynamically determined based on each entry of the calibration table 135. More specifically, the calibration logic 125 may measure a steepness (e.g., a transmission power metric) of a series of plotted entries (e.g., transmission power, estimated coefficient) from the calibration table 135. Depending on the embodiment, the transmission power metric may include other calculations, such as an accumulator and/or fractional adder. Accordingly, the calibration table 135 increases the transmission power if the transmission power metric is less than a predetermined metric threshold. Otherwise, the calibration table 135 stops increasing the transmission power if the transmission power metric is equal to or greater than the predetermined metric threshold. Once the transmission power is no longer increased, the calibration logic 125 no longer transmits the narrowband training signal to the RF power amplifier 145.

In some embodiments, the training signal may be a wideband signal (e.g., wideband training signal) rather than a narrowband signal. The wideband training signal may have a large and dynamic range of sample transmission powers (e.g., a set of transmission powers). The calibration logic 125 may transmit the wideband training signal to the RF power amplifier 145. The calibration logic 125 can receive, from the RF power amplifier 145, a loopback signal which provides an output power of the RF power amplifier 145 associated with each transmission power of the set of transmission powers. The calibration logic 125 may determine an estimated calibration coefficient (e.g., estimated coefficient) based on each loopback signal received. The calibration logic 125, for each transmission power, adds an entry into a calibration table 135 and stores the estimated coefficient associated with a respective transmission power of the set of transmission powers in the newly added entry indexed by the respective transmission power.

Transmitting the training signal (e.g., narrowband signal or wideband signal) to the RF power amplifier 145 to obtain estimated coefficients may be referred to, by the calibration logic 125, as online calibration.

The calibration logic 125 may identify a specified number of entries from the calibration table 135 to perform curve fitting. The specified number of entries may be a predetermined number of entries. For example, the calibration logic 125 may select the last predetermined number of entries from the calibration table 135. In other embodiments, the calibration logic 125 may dynamically determine the specified number of entries.

The calibration logic 125 may perform curve fitting on the specified number of entries from the calibration table 135. The calibration logic 125 may perform curve fitting using least square estimation, weighted least square estimation, or any other suitable estimation techniques. The curve fitting produced a fitted curve along a set of entries identified by calibration logic 125 using the specified number of entries. In some embodiments, the calibration logic 125 may perform interpolation, which uses the fitted curve to identify additional coefficients (e.g., interpolated coefficients) along a range of transmission powers covered by the set of entries. In response, the calibration logic 125 adds an entry, for each interpolated coefficient, into a calibration table 135 and stores the interpolated coefficient in the newly added entry indexed by a transmission power associated with the interpolated coefficient. The calibration logic 125 may insert the newly added entry in a location of the calibration table 135 in which numerical ordering of the transmission powers is maintained.

The calibration logic 125 may perform extrapolation, which uses the fitted curve to project, extend or expand the fitted curve to identify additional coefficients (e.g., extrapolated coefficients or predicted coefficients) beyond the range of transmission powers covered by the set of entries. In some embodiments, the fitted curve may be projected, extended, or expanded to a predetermined maximum transmission power. In one instance, the predetermined maximum transmission power may be a transmission power value necessary to fully learn the non-linearity of the RF power amplifier 145 beyond the specified power index. In another instance, predetermined maximum transmission power may be the maximum transmission power of a signal that the RF power amplifier 145 can transmit.

In response, the calibration logic 125 adds an entry, for each extrapolated coefficient, into a calibration table 135 and stores the extrapolated coefficient in the newly added entry indexed by a transmission power associated with the extrapolated coefficient. The calibration logic 125 may insert the newly added entry in a location of the calibration table 135 in which numerical ordering of the transmission powers is maintained.

Performing curve fitting on one or more estimated coefficients to interpolate and/or extrapolate from a fitted curve associated with the performance of the curve fitting, additional coefficients (e.g., interpolated and/or extrapolated coefficients) may be referred to, by the calibration logic 125, as offline calibration.

Figures 2A, 2B:
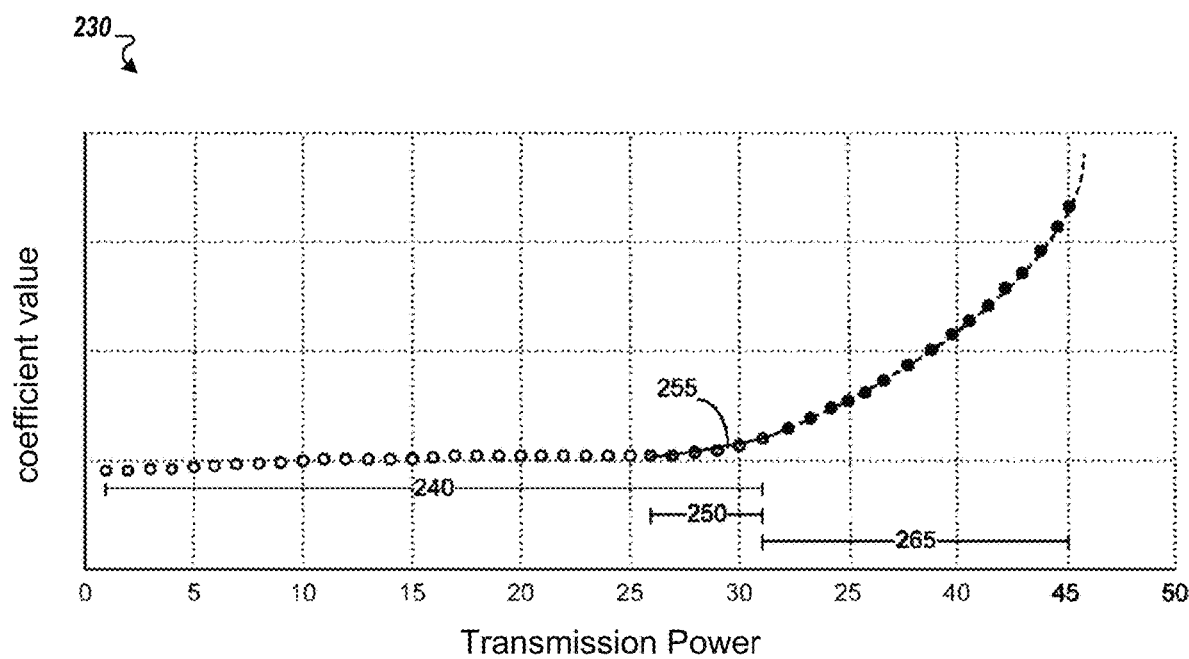
FIG. 2A is an illustrative example of a calibration table generated by the pre-distortion calibration, in accordance with some embodiment.
FIG. 2B is a graphical illustration of the calibration table generated by the pre-distortion calibration, in accordance with some embodiment.

FIG. 2A is an illustrative example of a calibration table 200 (e.g., table 200) generated by the pre-distortion calibration. Calibration table 200 is similar to the calibration table 135 of FIG. 1. The table 200 may include multiple rows (or entries), each identified by a transmission power. Each row stores a coefficient value corresponding to the transmission power. A first subset of the stored coefficient values may be obtained by transmitting a training signal with a transmission power to a power amplifier (e.g., RF power amplifier 145 of FIG. 1). The first subset of the stored coefficient values are typically the coefficients between an initial transmission power and a specified transmission power.

A second subset of the stored coefficient values may be obtained by performing curve fitting on one or more of the first subset of the stored coefficient values and interpolating, from a fitted curve produced by the curve fitting, the second subset of stored coefficient values. The second subset of the stored coefficient values may be one or more additional coefficient values between the initial transmission power and the specified transmission power. The additional coefficient values are not included in the one or more coefficient values of the first subset of the stored coefficient values. A third subset of the stored coefficient values may be obtained by performing extrapolating, from the fitted curve, one or more additional coefficient values beyond the initial transmission power and the specified transmission power (e.g., from the specified transmission power to a maximum transmission power). Accordingly, the additional coefficient values are separate and unique from the first and second subsets of the stored coefficient values.

FIG. 2B is a graphical illustration (e.g., graph 230) of the calibration table (e.g., table 200 of FIG. 2A) generated by the pre-distortion calibration. The first subset of the stored coefficient values within a first range of transmission powers 240 represents all the coefficient values (e.g., estimated coefficients) obtained through the online calibration. The stored coefficient values within a second range of transmission powers 250 represent a subset of the first subset of the stored coefficient values used for curve fitting. The curve fitting produces a fitted curve 255. The fitted curve 255 may be used to interpolate additional coefficient values (e.g., interpolated coefficients), which would typically fall within the second range of transmission powers 250. The fitted curve 255 may be extended to extrapolate additional coefficient values (e.g., extrapolated or predicted coefficients). The fitted curve 255 may be extended according to a third range of transmission powers 265, which is outside the first range of transmission powers 240 (and inherently the second range of transmission powers 250). The third range of transmission powers 265 may include all possible extrapolated coefficients that can fall within the third range of transmission powers 265 (e.g., the third range of transmission powers 265).

FIG. 3 is a flow diagram of an example method 300 for improving the digital pre-distortion calibration of a radio frequency power amplifier in accordance with some embodiments. Method 300 may be performed by processing logic of a wireless device. The processing logic performing method 300 may include hardware (e.g., circuitry, dedicated logic, programmable logic, microcode, etc.), firmware, and/or software, or any combination thereof. In some embodiments, method 300 may be performed by a processing device 120 (or any other processing logic) of wireless device 110 of FIG. 1. The processing device 120 performing method 300 may execute instructions of pre-distortion calibration logic 125. In certain embodiments, method 300 may be performed by a single processing thread. Alternatively, method 300 may be performed by two or more processing threads, each thread executing one or more individual functions, routines, subroutines, or operations of the method. The processing threads implementing method 300 may be synchronized (e.g., using semaphores, critical sections, and/or other thread synchronization mechanisms). Alternatively, the processing threads implementing method 300 may be executed asynchronously with respect to each other. Various operations of method 300 may be performed in a different order compared with the order shown in FIG. 3. Some operations of method 300 may be performed concurrently with other operations. Some operations may be optional.

At block 310, the processing logic may initiate digital pre-distortion calibration of a power amplifier of a radio frequency (RF) module. As previously described, the digital pre-distortion calibration may be initiated in response to a trigger event. For example, the power-up of the wireless device, the temperature of the wireless device exceeding a predetermined temperature value, or the time since the last initiation of the digital pre-distortion calibration exceeds a predetermined time value.

At block 320, the processing logic may determine, based on a transmission power of a training signal transmitted to the power amplifier between a first transmission power value and a second transmission power value, a set of estimated coefficients. The first transmission power value may be an initial transmission power value. The second transmission power value may be dynamically determined by calculating a transmission power metric and comparing it to a predetermined metric threshold. The transmission power metric corresponds to the steepness of all previous estimated coefficients. Accordingly, the transmission power is gradually increased until the transmission power metric exceeds the predetermined metric threshold. In some embodiments, the second transmission power value is a predetermined transmission power value based on regulatory regulations. Each estimated coefficient of the set of estimated coefficients is determined by incrementing the transmission power of the training signal by a predetermined step value between the first transmission power value and the second transmission power value.

As previously described, the training signal may be a narrowband signal or a wideband signal. In some embodiments, if the training signal is a wideband signal, the wideband signal includes a set of sample instantaneous transmission powers associated with the wideband signal. Accordingly, the method 300 iterates through each of the set of sample instantaneous transmission power to obtain the set of estimated coefficients.

At block 330, the processing logic may generate, based on a subset of the set of estimated coefficients, a set of predicted coefficients. The set of predicted coefficients is derived from a fitting curve applied to the subset of the set of estimated coefficients. The fitting curve may be based on a least square estimation or a weighted least square estimation. As previously described, the subset is selected from the set of estimated coefficients. In some embodiments, the selection of the subset may be based on a transmission power metric or a predetermined number of estimated coefficients (e.g., the last predetermined number of estimated coefficients). The set of predicted coefficients is generated by extending a fitted curve associated with the curve fitting from the second transmission power value to a maximum power of the power amplifier RF module. Accordingly, the set of predicted coefficients is derived from the extended fitted curve between the second transmission power value and a maximum power of the power amplifier of the RF module.

At block 340, the processing logic may store the set of estimated coefficients and the set of predicted coefficients. As previously described, the set of estimated coefficients is stored after each transmission of the training signal at a transmission power value and receipt of the loopback signal. The set of estimated coefficients and the set of predicted coefficients collectively represent a set of coefficients between an initial transmission power value and a maximum transmission power value of the power amplifier.

Figure 4:
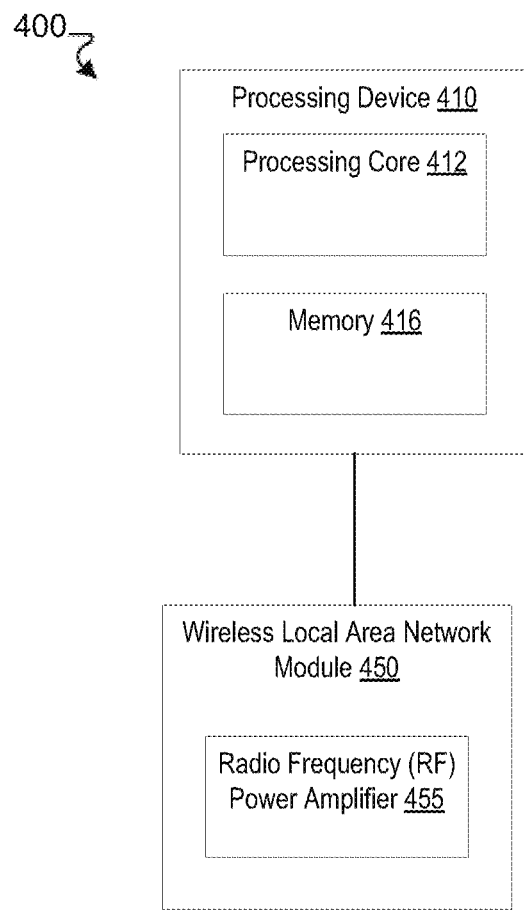
FIG. 4 is a block diagram of an example wireless device for pre-distortion calibration of a radio frequency power amplifier, in accordance with some embodiments.

FIG. 4 is a diagram of one embodiment of a wireless device 400, in accordance with some embodiments. The wireless device 400 includes various modules and components, but it should be understood that some modules and components may be absent for brevity.

Wireless device 400 may include a processing device 410. The processing device 410 may include a processing core 412 and a memory 416. In some embodiments, the memory 416 may be (or include) a non-volatile, e.g., read-only (ROM) memory, and/or a volatile, e.g., random-access (RAM) memory. In some embodiments, the memory 416 may be one or more data registers. The processing core 412 may execute instructions to perform operations, similar to the pre-distortion calibration logic 125 of FIG. 1, to learn the non-linearity of a power amplifier.

The wireless device may include a wireless local area network (WLAN) module 450. The WLAN module 450 may include an RF power amplifier 455. In response to a trigger event (e.g., power-up of wireless device, WLAN module exceeding a predetermined temperature value, or time since the last non-linearity learning exceeds a predetermined time value), the processing core 412 begins transmitting a training signal to the RF power amplifier 455. The training signal may be sinusoidal.

If the training signal is a narrowband signal, the processing core transmits the training signal starting with an initial transmission power value to a specified transmission power value. After each transmission of the training signal at a transmission power value, the processing core 412 determines an estimated calibration coefficient and stores the estimated calibration coefficient and corresponding transmission power value in memory 416 (e.g., register, non-volatile memory, or volatile memory). Additionally, the processing core 412 determines whether the specified transmission power value (e.g., a predetermined transmission power value) has been reached. In some embodiments, the processing core 412 may dynamically determine whether to continue to increase the transmission power value and obtain additional estimated calibration coefficients based on a transmission power metric (based on the steepness of the plotting of the previously estimated coefficients). The processing core 412 compares the transmission power metric to a predetermined metric threshold. If the transmission power metric exceeds the predetermined metric threshold, the processing core 412 ends transmission of the training signal. If the transmission power metric does not exceed the predetermined metric threshold, the processing core 412 continues to increase the transmission of the training signal with an increased transmission power value.

If the training signal is a wideband signal, the processing core transmits the training signal having a set of sample transmission power values. After each transmission of the training signal at a sample transmission power value of the set of sample transmission power values, the processing core 412 determines an estimated calibration coefficient and stores the estimated calibration coefficient and corresponding sample transmission power value in memory 416 (e.g., register, non-volatile memory, or volatile memory). The processing core 412 may decide to end further transmission of the training signal by determining whether a transmission power metric (based on the steepness of the plotting of the previously estimated coefficients) exceeds the predetermined metric threshold.

The processing core 412 may identify a specified number of estimated coefficients from memory 416 to perform curve fitting. In some embodiments, the specified number of estimated coefficients may be a predetermined number of entries (e.g., the last predetermined number of estimated coefficients). The processing core 412 may perform curve fitting using least square estimation, weighted least square estimation, or any other suitable estimation techniques on the specified number of estimated coefficients. The processing core 412 may perform interpolations to identify additional coefficients (e.g., interpolated coefficients) along a range of transmission power values covered by the specified number of estimated coefficients used for curve fitting. Each interpolated coefficient is stored in memory 416 with its corresponding transmission power value.

The processing core 412 may perform extrapolations to identify additional coefficients (e.g., extrapolated coefficients or predicted coefficients) beyond the range of transmission power values covered by the specified number of estimated coefficients used for curve fitting. The range of transmission power values may be from the transmission power value associated with the last estimated coefficient of the specified number of estimated coefficients used for curve fitting to a predetermined maximum transmission power (e.g., a maximum transmission power of a signal that the RF power amplifier 145 is capable of receiving). Each extrapolated coefficient is stored in memory 416 with its corresponding transmission power value.

It should be understood that the above description is intended to be illustrative and not restrictive. Many other implementation examples will be apparent to those of skill in the art upon reading and understanding the above description. Although the present disclosure describes specific examples, it will be recognized that the systems and methods of the present disclosure are not limited to the examples described herein but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware, or code set forth above may be implemented via instructions or code stored on a machine-accessible, machine-readable, computer-accessible, or computer-readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplar language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A method comprising:
    initiating digital pre-distortion calibration of a power amplifier of a radio frequency (RF) module to learn a non-linearity of the power amplifier;
    determining, based on varying a transmission power of a training signal transmitted to the power amplifier between a first transmission power value and a second transmission power value, a set of estimated coefficients;
    generating, based on a subset of the set of estimated coefficients, a set of predicted coefficients, wherein the set of predicted coefficients is obtained from a fitted curve derived from a fitting curve applied to the subset of the set of estimated coefficients;
    storing the set of estimated coefficients and the set of predicted coefficients which represent the non-linearity of the power amplifier; and
    linearizing, using the set of estimated coefficients and the set of predicted coefficients, the power amplifier.

2. The method of claim 1, wherein the second transmission power value is based on a transmission power metric and a predetermined metric threshold.

3. The method of claim 1, wherein the subset is selected from the set of estimated coefficients based on a transmission power metric.

4. The method of claim 1, wherein the fitting curve is based on at least one of: a least square estimation or a weighted least square estimation.

5. The method of claim 1, wherein the set of predicted coefficients are coefficients at transmission power values of the power amplifier of the RF module between the second transmission power value and a maximum transmission power value.

6. The method of claim 1, wherein each estimated coefficient of the set of estimated coefficients is determined by incrementing the transmission power of the training signal by a predetermined step value between the first transmission power value and the second transmission power value.

7. The method of claim 1, wherein the training signal is one of: a narrowband signal or a wideband signal.

8. The method of claim 1, wherein generating the set of predicted coefficients includes extending the fitted curve from the second transmission power value to a maximum power of the power amplifier.

9. A radio frequency (RF) module comprising: a power amplifier; and
a processing device coupled to the power amplifier, wherein the processing device is to:
initiate digital pre-distortion calibration of the power amplifier of the radio frequency (RF) module to learn a non-linearity of the power amplifier;
determine, based on varying a transmission power of a training signal transmitted to the power amplifier between a first transmission power value and a second transmission power value, a set of estimated coefficients;
generate, based on a subset of the set of estimated coefficients, a set of predicted coefficients, wherein the set of predicted coefficients is obtained from a fitted curve derived from a fitting curve applied to the subset of the set of estimated coefficients;
store the set of estimated coefficients and the set of predicted coefficients which represent the non-linearity of the power amplifier; and
linearize, using the set of estimated coefficients and the set of predicted coefficients, the power amplifier.

10. The radio frequency (RF) module of claim 9, wherein the second transmission power value is based on a transmission power metric and a predetermined metric threshold.

11. The radio frequency (RF) module of claim 9, wherein the subset is selected from the set of estimated coefficients based on a transmission power metric.

12. The radio frequency (RF) module of claim 9, wherein the fitting curve is based on at least one of: a least square estimation or a weighted least square estimation.

13. The radio frequency (RF) module of claim 9, wherein the set of predicted coefficients are coefficients at transmission power values of the power amplifier of the RF module between the second transmission power value and a maximum transmission power value.

14. The radio frequency (RF) module of claim 9, wherein generating the set of predicted coefficients includes extending the fitted curve from the second transmission power value to a maximum power of the power amplifier.

15. A processing device comprising:
a memory to store a plurality of coefficients and a set of instructions; and
a processing core to execute the instructions to perform operations comprising:
initiating digital pre-distortion calibration of a power amplifier of a radio frequency (RF) module to learn a non-linearity of the power amplifier;
determining, based on varying a transmission power of a training signal transmitted to the power amplifier between a first transmission power value and a second transmission power value, a set of estimated coefficients;
generating, based on a subset of the set of estimated coefficients, a set of predicted coefficients, wherein the set of predicted coefficients is obtained from a fitted curve derived from a fitting curve applied to the subset of the set of estimated coefficients;
storing the set of estimated coefficients and the set of predicted coefficients in the memory which represent the non-linearity of the power amplifier; and
linearizing, using the set of estimated coefficients and the set of predicted coefficients, the power amplifier.

16. The processing device of claim 15, wherein the second transmission power value is based on a transmission power metric and a predetermined metric threshold.

17. The processing device of claim 15, wherein the subset is selected from the set of estimated coefficients based on a transmission power metric.

18. The processing device of claim 15, wherein the fitting curve is based on at least one of: a least square estimation or a weighted least square estimation.

19. The processing device of claim 15, wherein the set of predicted coefficients are coefficients at transmission power values of the power amplifier of the RF module between the second transmission power value and a maximum transmission power value.

20. The processing device of claim 15, wherein generating the set of predicted coefficients includes extending the fitted curve from the second transmission power value to a maximum power of the power amplifier.

* * * * *